United States Patent [19]

Altman et al.

[11] Patent Number: 5,091,218
[45] Date of Patent: Feb. 25, 1992

[54] METHOD FOR PRODUCING A METALLIZED PATTERN ON A SUBSTRATE

[75] Inventors: Leonard F. Altman; Dale W. Dorinski, both of Coral Springs, Fla.

[73] Assignee: Motorola, Inc., Schaumburg, Ill.

[21] Appl. No.: 569,254

[22] Filed: Aug. 16, 1990

Related U.S. Application Data

[63] Continuation of Ser. No. 319,035, Mar. 6, 1989, abandoned.

[51] Int. Cl.⁵ .............................................. B05D 5/12
[52] U.S. Cl. ................................... 427/250; 427/97; 427/99; 427/124; 427/237; 427/238; 427/296
[58] Field of Search ............... 427/250, 97, 99, 294, 427/296, 237, 238, 124; 29/847, 848, 837; 174/265

[56] References Cited

U.S. PATENT DOCUMENTS

| | | | |
|---|---|---|---|
| 3,999,004 | 12/1976 | Chirino et al. | 174/68.5 |
| 4,258,468 | 3/1981 | Balde | 427/97 |
| 4,532,152 | 7/1985 | Elarde | 427/96 |
| 4,576,685 | 3/1986 | Goffredo et al. | 427/97 |
| 4,597,988 | 7/1986 | Kukamskis et al. | 427/97 |
| 4,651,417 | 3/1987 | Schumacher et al. | 29/848 |
| 4,666,739 | 5/1987 | Roubal | 427/97 |
| 4,751,481 | 6/1988 | Guzik et al. | 333/222 |

*Primary Examiner*—Shrive Beck
*Assistant Examiner*—Roy V. King
*Attorney, Agent, or Firm*—Juliana Agon; Daniel K. Nichols

[57] ABSTRACT

A method of producing a metallized pattern on a substrate includes the steps of providing a substrate having a high aspect ratio groove defining a desired metallization pattern and applying metallization to the substrate. The high aspect ratio groove is utilized to prevent metallization across the groove boundary thereby producing electrically isolated areas. The substrate can be a circuit board, hybrid module or other component carrying structure. Also the substrate can be a resonator or a stripline device in which the groove is used to electrically isolate a lead or wire extending from the substrate in the ground plane portion of the structure.

9 Claims, 2 Drawing Sheets

METHOD FOR PRODUCING A METALLIZED PATTERN ON A SUBSTRATE

This is a continuation of application Ser. No. 07/319,035 filed Mar. 6, 1989 and now abandoned.

BACKGROUND OF THE INVENTION

This invention relates to a method of defining metallized patterns on a substrate in general and particularly to a method that does not use masks or resist to delineate metallized areas. When applying metallization to a substrate such as by vacuum metallization operations, the delineation of metallized areas is accomplished either by the use of masking tools or by photoresist application which requires exposure and developing. For example, a molded resonator having metallized outer areas, is illustrated in U.S. Pat. No. 4,751,481, the disclosure of which is incorporated by reference. In this patent isolated electrical areas are provided by applying resist to depressions which define islands that are to be electrically isolated from the metallization of the ground plane on the resonator. Sputtering or vacuum deposition is then utilized to apply the metallization to the member. The resist prevents the metallization from adhering at the locations where the resist has been applied. Consequently, electrically isolated metallized areas are provided as defined by the applied resist. Such a technique requires the application of resist to the member prior to metallization. It would be advantageous if this step could be eliminated while still providing electrically isolated areas after metallization.

SUMMARY OF THE INVENTION

The method of manufacturing a metallized substrate does not require the use of resist or masking in order to define electrically isolated areas.

A method of manufacturing a substrate having a metallized pattern comprises the steps of providing a substrate having a high aspect ratio groove defining a desired metallization pattern, and applying metallization to the substrate.

In one aspect of the invention, the metallization is vacuum deposited. In another aspect of the invention, the grooves have an aspect ratio of at least 3. In still another aspect of the invention, the grooves have an aspect ratio of approximately 8.

In an aspect of the invention, the substrate is a molded material. In yet another aspect of the invention, the substrate is polyetherimide. In still another aspect of the invention, the substrate provides a resonator or stripline structure. A conductive member or wire extends from the substrate and the groove is located about the wire element to electrically isolate the member.

DESCRIPTION OF THE PREFERRED EMBODIMENT

Figure 1:
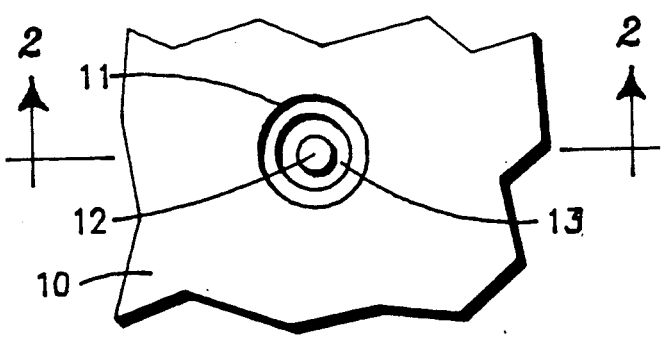
FIG. 1 is a fragmentary top plan view of an electrical substrate in accordance with present invention.
Figure 2:
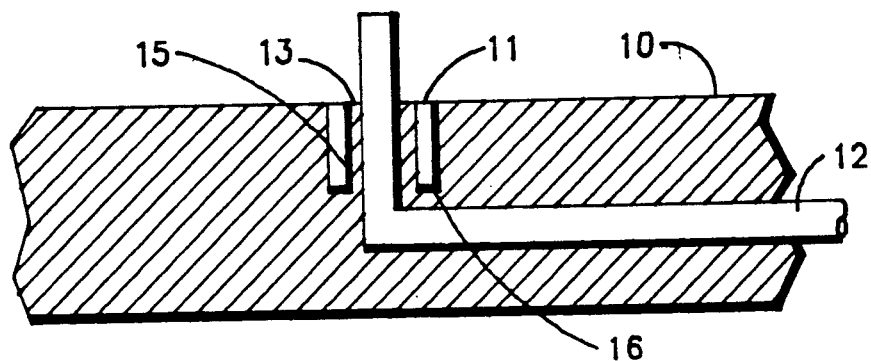
FIG. 2 is a side elevational view taken on line 2—2 of FIG. 1.

Referring now by characters of reference to the drawings, and first to FIG. 1, it will be understood that the substrate 10 is provided with at least one high aspect ratio slot or groove 11 which is used in conjunction with the metallization process to define electrically isolated areas on the substrate. This particular illustrated embodiment could be utilized for a molded resonator such as that illustrated in U.S. Pat. No. 4,751,481. A formed metal element or conductive member 12 passes through the surface of substrate 11 at an island 13 defined by the groove 11. As can be more clearly seen in FIG. 2, the groove 11 has a depth as defined by its side wall 15 substantially greater than its width as defined by its bottom wall 16. An aspect ratio (height to width ratio) of at least 3 to 1 and preferably on the order of 8 to 1 is utilized for groove 11.

Figure 3:
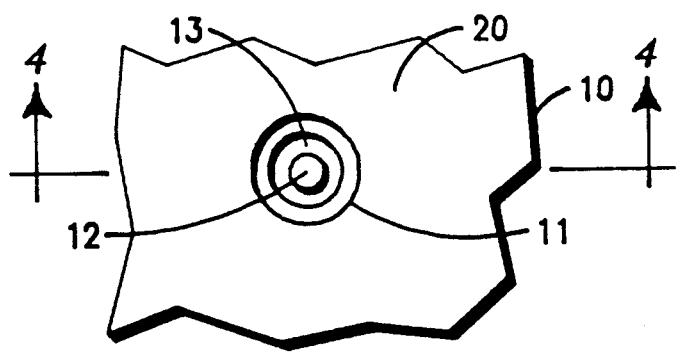
FIG. 3 is a top plan view of the substrate of FIG. 1 after metallization.
Figure 4:
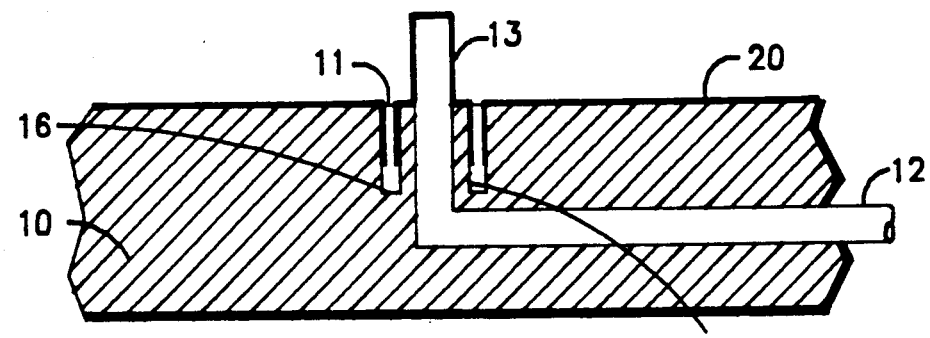
FIG. 4 is a side elevational view taken along line 4—4 of FIG. 3.
Figure 5:
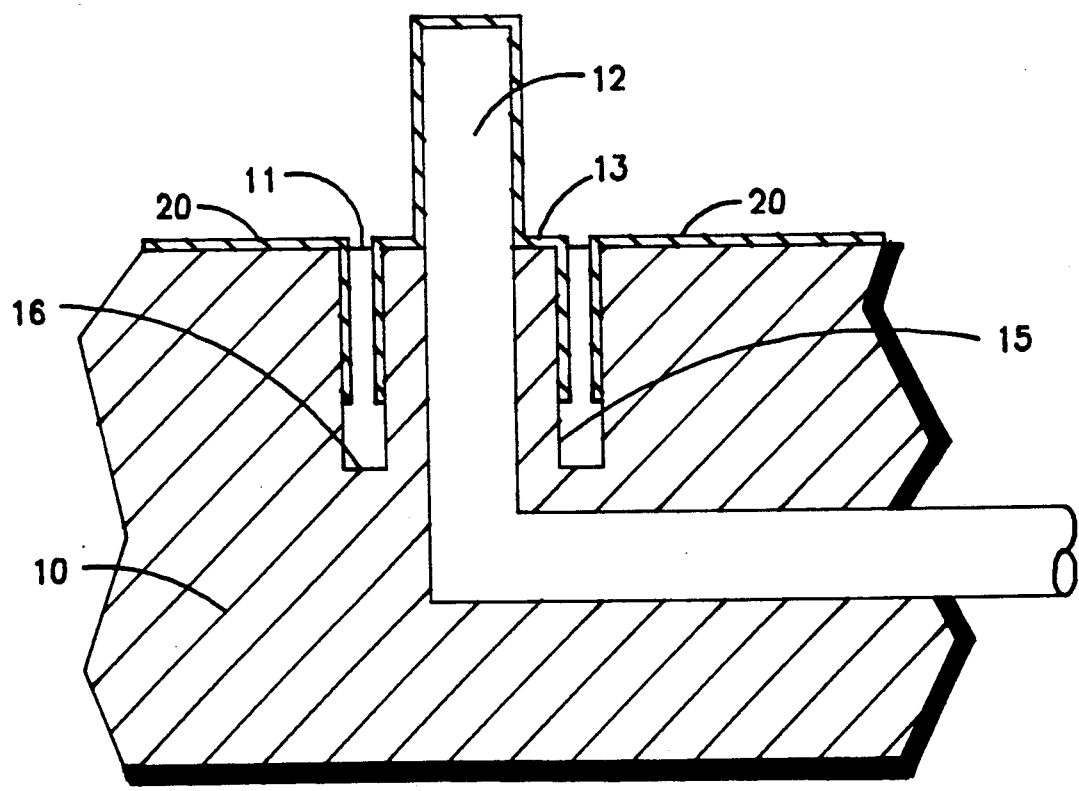
FIG. 5 is an enlarged view showing a slot area of FIG. 4.

Metallization is then applied to the substrate 10 as by sputtering or vacuum deposition. If desired these metallized areas can then be metal plated. The metallized substrate is illustrated in FIG. 3. As is more clearly seen in FIGS. 4 and 5, the vacuum deposited metal is not deposited fully to the bottom of the groove 11. Due to the high aspect ratio of the groove, metallization 20 extends only partially down the sidewalls 15 and does not reach and extend across the bottom wall 16. Consequently, the metallization 20 on the island area 13 is electrically isolated from the other metallization on the surface of the substrate 10. The required aspect ratio of groove 11 depends on the thickness of the sputtered metal. Greater thicknesses of metal applied to the substrate 10 require higher aspect ratios to prevent continuous metallization down the side walls 15 and across the bottom wall 16.

It will be appreciated that other electrically isolated patterns such as circuit traces and the like can be defined on the substrate 10 by utilizing suitable grooves 11. Where the substrate 11 is a molded material such as a polyetherimide, the grooves can be provided as part of the molding process. Other moldable materials such as polyethersulfone or polyarylsulfone could also be utilized. For substrate of other materials, for example ceramic, the grooves can be provided by utilizing an appropriate milling or laser cutting process. The electrically isolated metallized areas can be defined for a substrate circuitboard or the like, solely by location of the grooves 11 and as such does not require any masking, photo resist, or etching process to define and delineate metallization areas.

Figure 6:
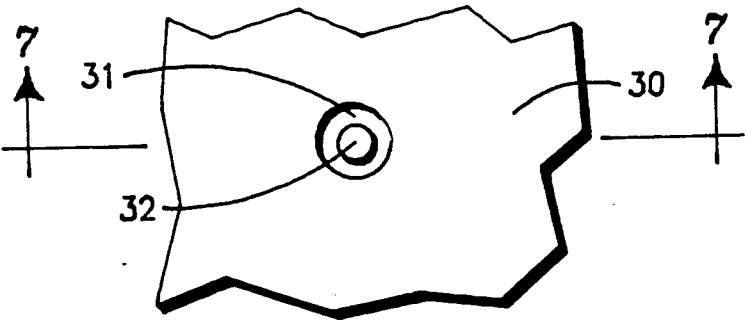
FIG. 6 is a fragmentary top plan view of another electrical substrate in accordance with the present invention.
Figure 7:
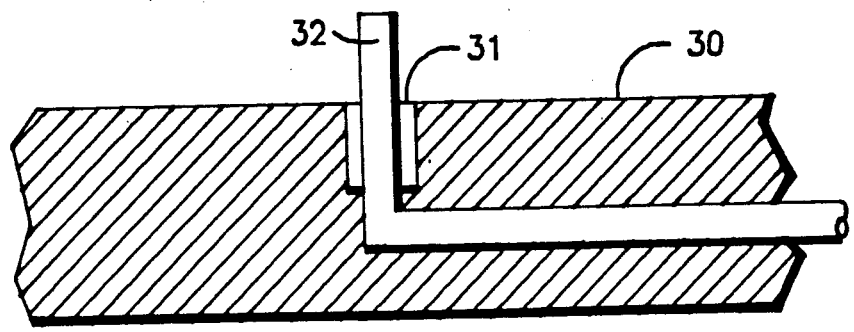
FIG. 7 is a side elevational view taken on line 7—7 of FIG. 6.

FIGS. 6 and 7 illustrate a modified embodiment in which a wire extending from the substrate is electrically isolated from metallization on the substrate. In this embodiment, the substrate 30 is provided with a groove 31 located immediately about a lead or wire 32 extending through the surface of a substrate. This substrate is particularly useful where the substrate is to be utilized as a resonator or stripline filter with an internal wire element or conductive member. A high aspect ratio groove 31 is provided. When the substrate 30 is metallized, the metal will adhere to both the substrate 30 and the wire 32, but will not extend all the way down the wire 32 or groove 31 thereby providing the desired electrical isolation.

We claim as our invention:

1. A method of manufacturing a substrate having a metallization pattern comprising the steps of:
   providing a substrate having a high aspect ratio non-connecting groove,
   said groove having a bottom surface framed by a plurality of sidewalls,
   said aspect ratio being sufficiently high to define an area electrically isolated from a desired metallization pattern; and
   applying metallization to the substrate by vacuum deposition whereby the high aspect ratio of the non-connecting groove prevents metallization of the bottom surface and complete metallization of said plurality of sidewalls of the groove thereby electrically isolating said groove from said metallization pattern.

2. A method of manufacturing a metallized substrate as defined in claim 1 in which the metallization is applied by sputtering.

3. A method of manufacturing a metallized substrate as defined in claim 2 in which the groove has an aspect ratio of at least 3.

4. A method of manufacturing a substrate as defined in claim 3 in which the groove has an aspect ratio of approximately 8.

5. A method of manufacturing a substrate as defined in claim 3 in which the substrate is a molded material.

6. A method of manufacturing a substrate as defined in claim 5, in which the substrate is polyetherimide.

7. A method of manufacturing a substrate having a conductive member extending through its surface comprising the steps of:
   providing a substrate having a conductive member extending through its surface and having a high aspect ratio non-connecting groove about the member,
   said groove having a bottom surface framed by a plurality of sidewalls,
   said aspect ratio being sufficiently high to define an area electrically isolated from said member; and
   applying metallization to the substrate by vacuum deposition whereby the high aspect ratio of the non-connecting groove prevents metallization of the bottom surface and complete metallization of said plurality of sidewalls of the groove thereby electrically isolating said groove from said member.

8. A method of manufacturing a substrate as defined in claim 7, in which the groove is spaced from the conductive member.

9. A method of manufacturing a substrate as defined in claim 7, in which the groove is immediately adjacent to the conductive member.

* * * * *